United States Patent [19]

Buckle

[11] 4,270,159
[45] May 26, 1981

[54] TRANSISTOR PROTECTION CIRCUITS

[75] Inventor: Allan S. Buckle, Kenilworth, England

[73] Assignee: Lucas Industries Limited, Birmingham, England

[21] Appl. No.: 35,262

[22] Filed: May 1, 1979

[51] Int. Cl.³ .............................................. H02H 3/38
[52] U.S. Cl. .................................. 361/79; 330/207 P; 361/91
[58] Field of Search ................... 330/295, 298, 207 P; 361/56, 57, 79, 91

[56] References Cited

U.S. PATENT DOCUMENTS

| 3,668,545 | 6/1972 | Von Recklinghausen | 330/298 |
| 4,105,944 | 8/1978 | Anderson | 330/295 X |

OTHER PUBLICATIONS

"Power Amplifier With Output Stage Protection Circuit"-Lamoreaux, IBM Tech. Disc. Bul., vol. 14, No. 3, 8/71.

Primary Examiner—Harry E. Moose, Jr.
Attorney, Agent, or Firm—Holman & Stern

[57] ABSTRACT

A circuit employing parallel power transistors intended to share the load current, includes a separate current sensing resistor for each transistor and independently operating protection circuits controlled by the voltage drop across the associated sensing resistor to limit the current in each power transistor to a safe level. The protection circuits each include zener diodes and resistors connected to vary the current limit in accordance with the voltage across the power transistors.

11 Claims, 3 Drawing Figures

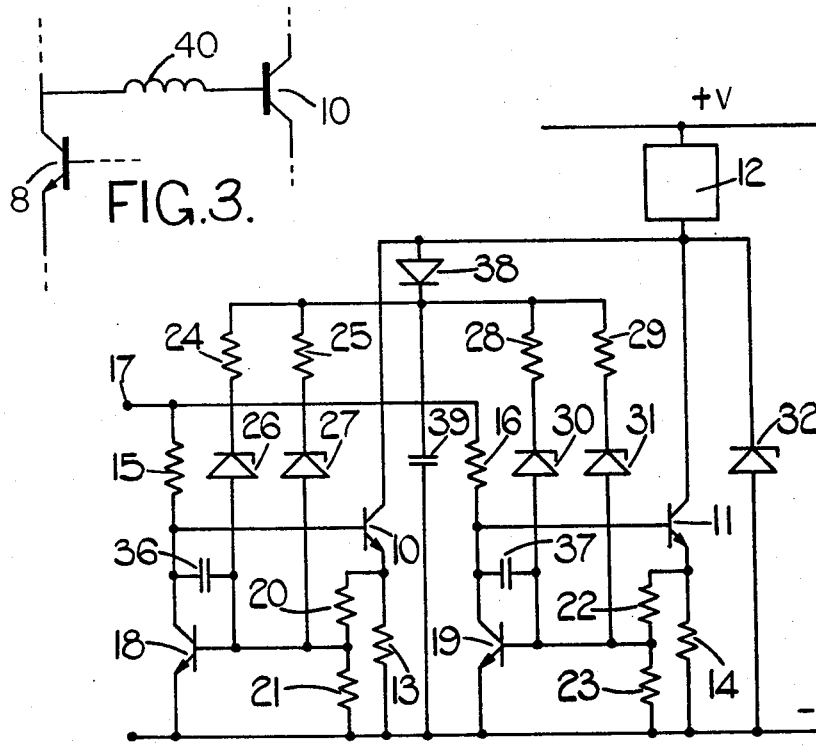
FIG.3.
FIG.1.
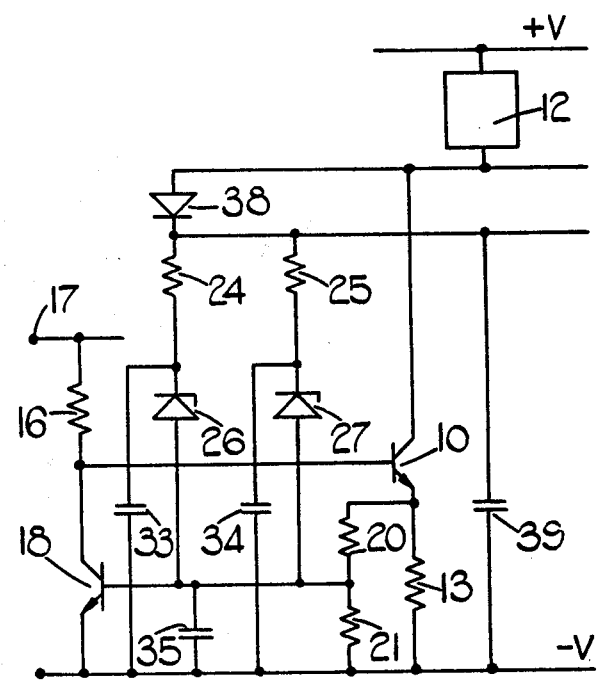
FIG.2.

TRANSISTOR PROTECTION CIRCUITS

It is conventional in high power transistor equipment to utilize two or more power transistors connected in parallel to obtain the desired power and current levels. With such parallel arrangements difficulty may be experienced in protecting the power transistors because they do not share the load current equally.

Conventionally base resistors and/or emitter resistors are used in series with the transistors, the resistors being selected to ensure that the current is shared in one specific set of operating conditions. Even so when designing an output stage using parallel transistors it is usual to derate the transistors by 10 to 50% to allow for mismatching.

The present invention has for its object to provide a parallel power transistor circuit with protection means enabling the individual transistors to be operated efficiently.

In its simplest form, the invention provides the combination of a plurality of power transistors in parallel and a plurality of means sensitive to the current in respective ones of the power transistors for limiting the current in each power transistor independently of that in the other power transistor or transistors.

Preferably means is provided for varying the current limit of each power transistor in accordance with the voltage across the collector-emitter of that transistor so to provide so-called "safe operating area" limiting.

In the accompanying drawings,

FIG. 1 is a circuit diagram of one example of a circuit in accordance with the invention;

FIG. 2 is a partial circuit diagram showing a modified form of the circuit; and

FIG. 3 is a partial circuit diagram showing a modified transient suppression arrangement.

Referring firstly to FIG. 1, the circuit shown includes two npn power transistors 10, 11 in parallel i.e., with their emitter-collector paths in parallel circuits. The collectors of the transistors 10, 11 are connected together and via a load 12 to a positive supply V+. The emitters of the two transistors 10, 11 are connected by respective current detector resistors 13, 14 to a negative supply V−.

The bases of the two transistors 10, 11 are connected by respective base resistors 15, 16 to a common control terminal 17. The conduction of the two transistors 10, 11 is controlled by the voltage at the terminal 17.

Each transistor 10, 11 has its own independent current limiting protection circuit. Such circuit includes an npn transistor 18 or 19 with its emitter connected to the negative supply and its collector connected to the base of the associated transistor 10 or 11. The base of transistor 18 is connected to the junction of two resistors 20, 21 in series across the resistor 13. Similarly the base of transistor 19 is connected to the junction of two resistors 22, 23 in series across resistor 14.

In addition the base of transistor 18 is connected by two parallel circuits each consisting of the series combination of a resistor 24, 25 with a zener diode 26, 27 to the cathode of a diode 38 having its anode connected to the collectors of the transistors 10, 11. Similarly resistors 28, 29 and zener diodes 30, 31 connect the base of transistor 19 to cathode of diode 38. A capacitor 39 is connected between the cathode of diode 38 and the negative supply.

Both transistors 10, 11 are protected from simple over voltage by means of a common zener diode 32 connected between the collectors of transistors 10, 11 and the negative supply.

The resistors 13, 20 and 21 cause a voltage signal to be applied to the base of the transistor 18 which is directly proportional to the emitter current in transistor 10 so that transistor 18 starts to turn on when a predetermined current is reached and prevents that current from being exceeded, when the voltage across the transistor 10 is insufficient to cause either zener diode 26 or 27 to conduct. As the voltage across the transistor 10 rises the zener diode 26 becomes conductive so that the voltage signal on the base of transistor 18 increases for a given transistor 10 current. Thus the current limit is reduced linearly with rising voltage above the reverse breakdown voltage of zener diode 26. When the voltage across transistor 10 rises higher still zener diode 27 starts to conduct so that the current limit decreases linearly with using voltage at a steeper rate. Finally the maximum voltage across transistor 10 is determined by zener diode 32.

The protection circuit thus limits the transistor voltage and current to what is known as the maximum safe operating area for the transistor. Thus the initial current limit at low voltages is set to ensure that the manufacturers specified maximum operating current is not exceeded. At medium voltages (between breakdown of zener diodes 26 and 27) the power dissipated by the transistor is limited and at higher voltage power dissipation is further limited to prevent secondary breakdown effects.

It will be noted that the components which determine the current limit for each transistor 10, 11 operate independently for each such transistor. As a result there is no need for gain matching of the transistors 10, 11 to be carried out. Thus, in use, as the voltage signal at terminal 17 rises the transistor 10 or 11 which has the higher gain will turn on first and carry the bulk of the load current. When the current limit for that transistor is reached the other transistor will carry a greater proportion of the load current until it too reaches its limit condition.

The transistors 18, 19 being low-power transistors may be found to have faster switching characteristics than the output transistors which they are intended to protect. Accordingly they may be switched by transient overvoltages which have no effect on the output transistors. To prevent such switching and to maintain stability of operation there may be a delay capacitor 36, 37 associated with each transistor 18, 19, such capacitor being connected between the collector and base of the associated transistor. Alternatively, where the transistor 10, 18 and some of the associated resistors are incorporated in an integrated circuit, the capacitor 36 may be omitted and, as shown in FIG. 3, a suitable inductance 40 included in series with the collector of the transistor 18, to match its switching characteristics to those of the output transistor 10.

The diode 38 and capacitor 39 operate to prevent high frequency oscillation of circuit as a result of any difference in the switching speeds of the transistors 10, 11.

It will be appreciated that the principal of the invention can be applied to any number of output transistors, each output transistor being limited to operate in its own safe operating area. No derating of the transistors is necessary.

Referring now to FIG. 2 the protection circuit is modified by the addition of three capacitors 33, 34 and 35. Capacitors 33 and 34 connect the cathodes of zener diodes 26, 27 to the negative supply and capacitor 35 connects the base of transistor 18 to the negative supply. Capacitor 35 acts to permit the low voltage current limit to be transiently higher than the steady state limit. Thus, if the circuit is used only for impulse operation, current peaks higher than the current limit are permitted. Similarly capacitors 33 and 34 allow higher current peaks in the medium and higher voltage range, since thermal and secondary breakdown effects are not encountered as a result of transient high current peaks.

In further modified forms of the invention one or more of the resistors 20, 24 and 25 (and 22, 28 and 29) may be replaced by a temperature dependent resistor to provide a safe operating area which varies with temperature. The transistors 18, 19 may be replaced by Darlington pairs or by field effect transistors. The circuit could also be modified to put the protection transistor in series with the bases of the output transistors, the protection transistors being normally conductive but arranged to be turned off as the current limit is exceeded. It will be appreciated that similar circuits can be designed for pnp transistors. The power transistors may, of course, be Darlington pairs.

I claim:

1. A transistor circuit comprising a power supply rail, a return rail, a load terminal for connection by a load to the supply rail, first and second power transistors having their collector-emitter paths in parallel between the load terminal and the return rail so as to share between them a load current, first and second means sensitive to the current carried by the first and second power transistors, respectively, and operating to limit the current in each power transistor, means sensitive to the voltage across the collector-emitter paths of the power transistors and connected to vary the current limit in accordance with said voltage, said voltage circuits each including a zener diode and a resistor, a diode having one pole connected to the load terminal, and a capacitor connecting the other pole of said capacitor to the return rail, the first and second series circuits being connected between said other pole of the diode and the respective current sensitive means.

2. A transistor circuit as claimed in claim 1 in which each current sensitive means comprises a resistor in series with the associated power transistor and a protection transistor controlled by the voltage across said resistor and connected to the base of the associated power transistor so as to shunt base current from that power transistor when the voltage across the resistor exceeds a predetermined limit.

3. A transistor circuit as claimed in claim 2 in which said resistor connects the emitter of the power transistor to a supply conductor and the protection transistor has its collector-emitter path connected between the base of the power transistor and said supply conductor, the protection transistor conducting when the voltage across said resistor exceeds said predetermined limit.

4. A transistor circuit as claimed in claim 3 in which the protection transistor is of the same conductivity type as the power transistor and has its emitter and collector connected to said supply rail and the base of the power transistor respectively.

5. A transistor circuit as claimed in claim 4 in which the base of the protection transistor is connected to a point on a resistive voltage divider chain connected across said resistor.

6. A transistor circuit as claimed in claim 5 including a further resistor and a further zener diode in parallel with said zener diode and resistor which are in series.

7. A transistor circuit as claimed in claim 4 or claim 5 including reactance means connected to the collector of each protection transistor and acting to slow down switching of the protection transistor.

8. A transistor circuit as claimed in claim 7 in which said reactance comprises a capacitor connected between the base and collector of said protection transistor.

9. A transistor circuit as claimed in claim 7 in which said reactance means comprises a inductor connected between the collector of the protection transistor and the base of the power transistor.

10. A transistor circuit as claimed in claim 4 or claim 5 further comprising a capacitor connected between the base of each protection transistor and said supply rail.

11. A transistor circuit as claimed in claim 6 further comprising a plurality of capacitors respectively connecting the junction of each zener diode and its associated series resistor to said supply rail.

* * * * *